(12) United States Patent
Guinea et al.

(10) Patent No.: US 7,154,945 B2
(45) Date of Patent: Dec. 26, 2006

(54) EQUALIZER

(75) Inventors: Jesus Guinea, Brembate (IT); Luciano Tomasini, Monza (IT); Carlo Maria Milanese, Olevano di Lomellina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1047 days.

(21) Appl. No.: 09/853,315

(22) Filed: May 10, 2001

(65) Prior Publication Data

US 2001/0040921 A1    Nov. 15, 2001

(30) Foreign Application Priority Data

May 12, 2000    (EP)    .................................. 00830343

(51) Int. Cl.
*H04L 7/30*    (2006.01)
*H04L 7/40*    (2006.01)
*H04L 25/03*   (2006.01)

(52) U.S. Cl. ..................... 375/229; 375/257; 333/28 R

(58) Field of Classification Search ................ 375/229, 375/230, 232, 257, 350; 333/18, 28 R; 379/398, 379/400; 708/322, 323
See application file for complete search history.

(56) References Cited

U.S. PATENT DOCUMENTS

| | | | |
|---|---|---|---|
| 4,273,963 A | 6/1981 | Seidel | ..................... 179/16 F |
| 5,257,286 A | 10/1993 | Ray | ............................. 375/12 |
| 5,699,022 A * | 12/1997 | Tovar | ........................... 333/18 |
| 5,805,031 A | 9/1998 | Cheng | ....................... 333/28 R |
| 5,940,441 A * | 8/1999 | Cranford et al. | ............. 375/232 |
| 5,978,417 A * | 11/1999 | Baker et al. | ................. 375/232 |
| 6,240,131 B1 * | 5/2001 | Cheng et al. | ................ 375/229 |

* cited by examiner

*Primary Examiner*—Betsy L. Deppe
(74) *Attorney, Agent, or Firm*—Lisa K. Jorgenson; Robert Iannucci; Seed IP Law Group PLLC

(57) ABSTRACT

A method and an equalizer circuit equalize signals transmitted on a line having an attenuation. The equalizer circuit includes: an analogical adaptive filter applied in series with the line and includes plural transconductance filters each having a bias current. The adaptive filter has a pole and a zero each having a frequency position in the working band that is variable in response to the bias current. The equalizer circuit includes a retroaction circuit applied to the output of the filter and able to vary the bias current according to the varying of the attenuation of the line. The bias current of the transconductance filters has a prefixed value and is made to vary at the increasing of the attenuation so that the pole is moved toward high frequencies and the zero is moved toward low frequencies.

24 Claims, 5 Drawing Sheets

US 7,154,945 B2

EQUALIZER

BACKGROUND OF THE INVENTION

1. Field of the Invention

The present invention refers to a method to equalize signals transmitted on a line as well as an equalizer filter realized in CMOS technology and besides an integrated circuit comprising an equalizer circuit.

2. Description of the Related Art

In high speed line communications, for instance in the case of data transmission of SDH equipment, the only filtration of the received signal is not sufficient to recover the data with a small error rate. An equalizer circuit is therefore necessary to compensate the line loss and improve the intersymbol interferences of the datum to recover. As known the line dispersion losses are linearly proportional to the length of the line and besides they are proportional to the square root of the frequency of transmission. The equalizer must therefore have a frequency response inversely proportional to that of the line. Particularly it is necessary an adaptive equalizer able to deal with variable lengths of line without altering significantly the intersymbol interferences.

BRIEF SUMMARY OF THE INVENTION

An embodiment of the present invention realizes an equalizer able to compensate the line attenuations in a simple and effective way.

Another embodiment of the invention is directed to a method that equalizes signals transmitted on a line comprising the following phases: applying an analog adaptive filter in series with said line, having a working frequency band and having at least one pole and at least one zero the position of which in said working frequency band is variable in response to the attenuation of said line; applying a retroaction circuit to the output of said filter able to vary the position of said at least one pole and at least one zero; setting said at least one pole and at least one zero in correspondence to a prefixed frequency of said working frequency band; moving the position of said at least one pole toward the high frequencies at the increasing of said attenuation of said line; and moving the position of said at least one zero toward the low frequencies at the increasing of said attenuation of said line.

An equalizer circuit according to an embodiment of the present invention equalizes signals transmitted on a line having an attenuation comprising: an analog adaptive filter applied in series to said line comprising plural transconductance filters having a bias current each and to which it is associated at least one pole and at least one zero the position in frequency of which in the working band is variable in response to said bias current; a retroaction circuit applied to the output of said filter able to vary said bias current; said bias current varies at the varying of said attenuation of said line; wherein said transconductance filters have said bias current of prefixed value; said bias current is made to vary at the increasing of said attenuation so that said at least one pole is moved toward the high frequencies; and said bias current is made to vary at the increasing of said attenuation so that said at least a zero is moved toward the low frequencies. The equalizer circuit can be an integrated circuit of CMOS type.

Thanks to the present invention it is possible to realize a linear equalizer that does not require of any external regulation. It results to be very simple as the retroaction loop checks only the output voltage. Besides realizing it completely in CMOS technology it is possible to integrate it with other circuits on a single chip.

BRIEF DESCRIPTION OF THE SEVERAL VIEWS OF THE DRAWINGS

The characteristics and the advantages of the present invention will result evident from the following detailed description of one of its embodiment, illustrated as example not limitative in the joined sketches, in which.

DETAILED DESCRIPTION OF THE INVENTION

Figure 1:
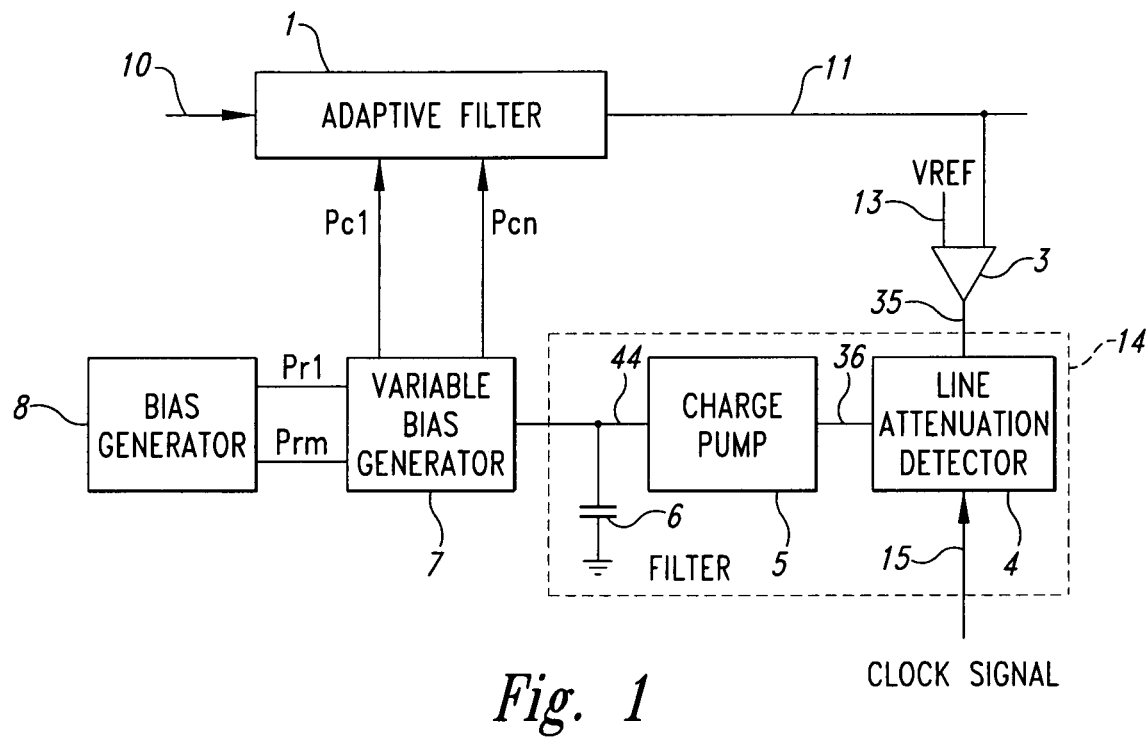
FIG. 1 shows a blocks scheme of an equalizer according to the present invention.

A block scheme of an equalizer according to an embodiment of the present invention, shown in FIG. 1, comprises an input signal 10, coming from a line, applied to an adaptive filter 1 which provides an output 11. The signal at the output of the adaptive filter 1 is applied to a comparator 3 that compares this signal 11 with a reference voltage 13. At the output of the comparator 3 there is a filter 14 composed of a first circuit 4 that provides an indication of the variation of the line attenuation, connected to a charge pump 5 which in turn is connected to a capacitor 6. The circuit 4 is sampled by a working frequency 15. The voltage at the terminals of the capacitor 6 is applied to a variable bias generator 7. To the generator 7 are applied, preferably, also the signals Pr1–Prm coming from a bias generator 8 dependent on the process. The signals Pc1–Pcn in output from the generator 7 are applied to the adaptive filter 1.

Figure 2A:
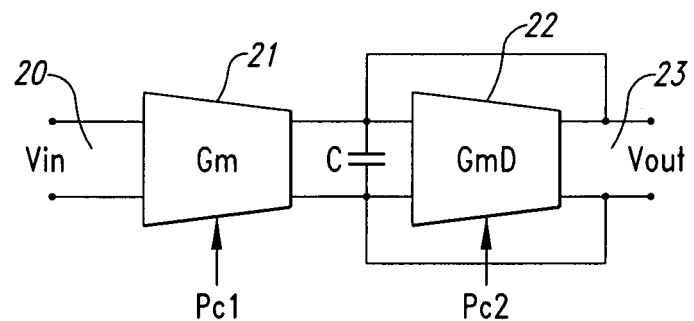
FIG. 2A shows a schematic circuit of an example of a transconductance filter and the FIG. 2B its Bode diagram.
Figure 2B:
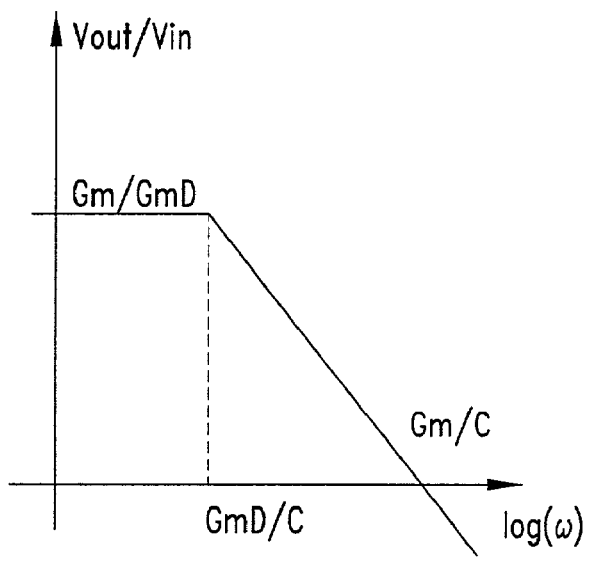

The filter 1 comprises preferably adaptive filters of the transconductance type with biquadratic cells, for instance in FIG. 2A is drawn the block scheme of a transconductance filter having one pole which has an input 20 and it comprises a first stage 21 having transconductance Gm, and a second stage 22 having transconductance GmD, an output 23. Between the first stage 21 and the second stage is connected a capacitor C. To the first stage 21 is connected a terminal Pc1 and to the second stage 22 is connected a terminal Pc2, which receives the bias current. The bias current Pc2 varies the GmD transconductance of the circuit which varies the position of the pole in frequency in the working band accordingly. In fact it could be seen from the FIG. 2B, where it is represented the Bode diagram of the circuit of FIG. 2A, that the position of the pole in frequency is given by the division GmD/C and the point in which the gain module is equal to 1 it is equal to Gm/C. Therefore, varying the bias current Pc2, varies the value of GmD and therefore the pole frequency position. The bias current Pc1 varies the Gm transconductance of the circuit which, if varied in a separate way as regards the current Pc2, varies the continuous gain accordingly, which as shown in FIG. 2B is equal to Gm/GmD. If the bias currents Pc1 and Pc2 vary equally, then the pole position moves but the continuous gain does not vary.

To each filter of this type could be associated either one pole or one zero in accordance to the particular type of circuit. To be able to vary the position of each pole and of each zero it is necessary a bias current for each of them and a current to make vary (increase) the continuous gain of a prefixed value. In an example of realization of the present invention, the filter 1 comprises two biquadratic filters and one at a single stage, for a total of 5 poles and of 5 zeros. Such types of filters are well known by the skilled in the art, and they are not furtherly described, an example of such filters could be found in the article of F. Rezzi, I. Bietti, M. Cazzaniga and R. Castello by the title "A 70 mW seventh order filter with 7–50 MHz cut-off frequency and programmable boost and group delay equalization" published in the IEEE Journal of solid state circuits, vol. 32, No. 12, December 1997.

The signals Pc1–Pcn correspond to the bias current (variable at the varying of the line attenuation) of the transconductance filters; preferably these bias currents are compensated by the Pr1–Prm signals that correspond to the currents supplied by the bias generator 8 which depend on the thermal and constructive variations of the device.

Figure 3:
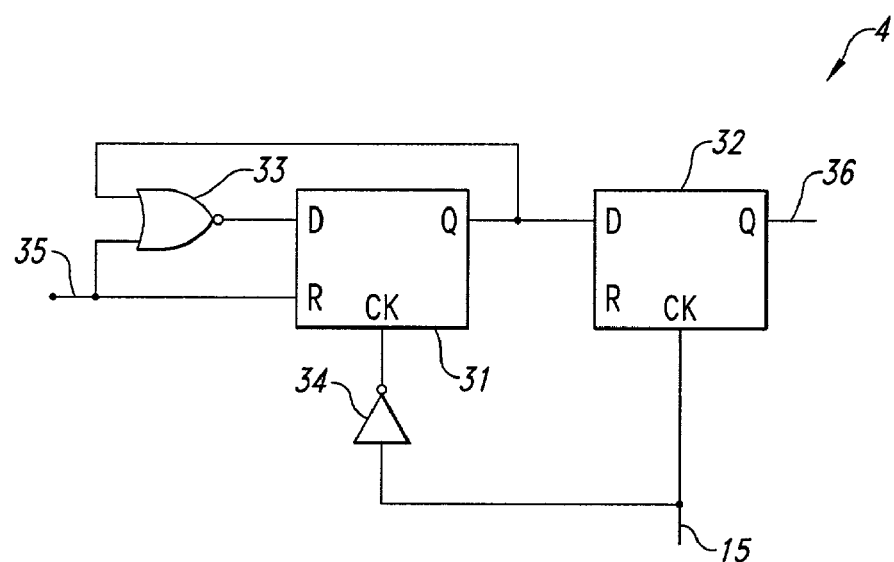
FIG. 3 shows a schematic circuit of an example of a circuit 4 that provides an indication of the variation of the line attenuation.

A schematic circuit of an example of the line attenuator detector 4 that supplies an indication of the variation of the line attenuation, shown in FIG. 3, comprises a first bistable circuit 31 of D type and a second bistable circuit 32 of D type. The output of the comparator 3 is applied to a terminal 35 of the first bistable circuit 31 which corresponds to the reset input R of the circuit and also to an input of a NOR circuit 33, the output Q of which is connected to the input D of the bistable 31. The output Q of the bistable 31 is applied the input D of the second bistable circuit 32, the output Q of which is applied to the output terminal 36. The output Q of the bistable 31 is also applied to the second input of the NOR circuit 33. A clock signal is applied to the terminal 15 that it is connected to the clock input of the bistable 32 and it is also connected to the clock input of the bistable 31 through an inverter circuit 34.

Figure 4:
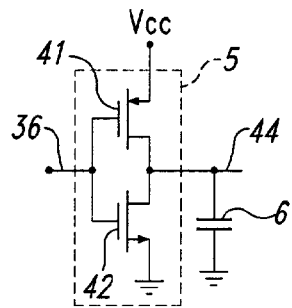
FIG. 4 shows a schematic circuit of an example of the circuit of charge pump 5.

A schematic circuit of an example of the charge pump circuit 5, shown in FIG. 4, comprises a first transistor 41 with p-channel and a second transistor 42 with n-channel having the gates connected together in order to form an input terminal 36 (connected to the output of the circuit 4), the source of the transistor 41 is connected to the supply voltage, the transistor source 42 is connected to ground, the drain of the transistor 42 is connected to the drain of the transistor 41 and they are connected to a terminal 44 of the capacitor 6, the other terminal of the capacitor 6 is set to ground. If the input signal 36 of the charge pump circuit 5 is at high level, the capacitor 6 discharges itself, if the signal is at a low level the capacitor 6 charges itself.

The whole of the circuits 4, 5 and 6 constitute the filter 14 that integrates the signal in output from the comparator 3 and it provides in output a signal proportional to the course of the line attenuation that is used to predispose the bias and control current Pc1–Pcn of the filter 1.

Particularly, the circuit 4 drawn in FIG. 3 provides in output a signal, for instance of high level, if the signal output from the comparator 3 remains high for at least one clock cycle of the working frequency 15. By varying the working frequency 15, it is possible to vary the reaction times of the circuit in response to the line attenuation varying. The charge pump 5 charges and discharges the capacitor 6 so that the voltage across the capacitor is proportional to the value of line attenuation opportunely filtered.

Figure 5:
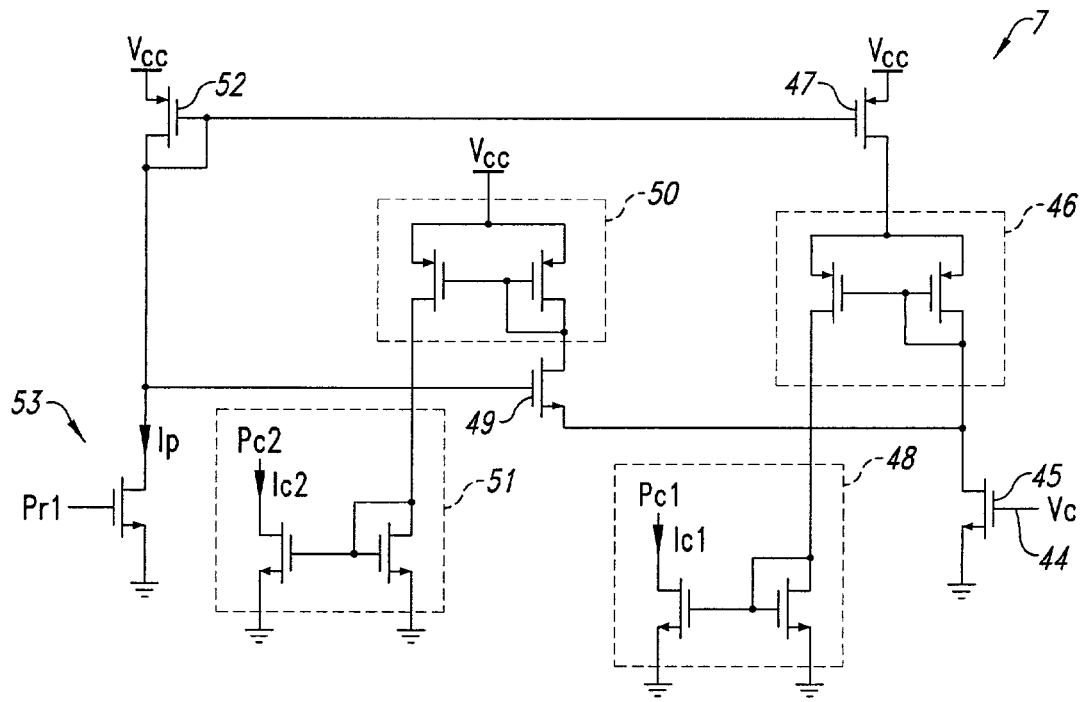
FIG. 5 shows a schematic circuit of an example of a variable bias generator 7.

A schematic circuit of an example of a variable bias generator 7, shown in FIG. 5, comprises an n-channel transistor 45 having a gate connected to a terminal 44 to which has been applied the voltage present on the capacitor 6, a source connected to ground, and a drain connected to a branch of a first current mirror 46 which is connected to the supply voltage Vcc through a p-channel transistor 47. The other branch of the current mirror 46 is connected to a branch of a second current mirror 48, and in the other branch of the second current mirror 48 flows a current Ic1 and corresponds to the terminal Pc1. The drain of the transistor 45 is connected also to the source of an n-channel transistor 49. The drain of the transistor 49 is connected to a branch of a third current mirror 50 which is connected directly to the supply voltage Vcc. The other branch of the third current mirror 50 is connected to a branch of a fourth current mirror 51, and in the other branch of the fourth current mirror 51 flows a current Ic2 and corresponds to the terminal Pc2. The gate of the transistor 49 is connected to the drain of a transistor 53 having a source connected to ground and a gate connected to the terminal Pr1. The gate of the transistor 49 is also connected to a p-channel transistor 52 connected like a diode, to which is applied the supply voltage Vcc and which forms a current mirror together with the transistor 47, the two gates of the two transistors 47, 52 being connected together.

In FIG. 5, only for representation simplicity have been drawn only the circuits that provide current to the two terminals Pc1 and Pc2 of the filter 1 depending on the value of the input Vc of the capacitor 6 and of the input Pr1 coming from the bias generator 8. Also in this case it has been considered for representation simplicity only one terminal of the plurality of the terminals Pr1–Prm.

The variable bias generator 7 must provide the bias currents by the terminals Pc1–Pcn to the various transconductance filters present in the filter 1. Such bias currents must be placed at quiescent (Vc=0), for instance placed for a line having length equal to 0 and they therefore must vary at the varying of the line attenuation. The generator 7 receives in input the Vc signal from the capacitor 6 and is able to absorb the current Ic1 (from the terminal Pc1). The current Ic1, which starting from Vc equal to null, linearly increases at the increasing of Vc, up to a limit of current equal to Ip/2, where Ip is the flowing current in the transistor 53, after that it begins to increase linearly the current Ic2, (up to a possible circuital limit). The current Ip could be generated by a fixed generator Ip but, the equalizer circuit comprises besides preferably the bias generator 8 which provides a bias current able to compensate the thermal and constructive variations of the equalizer. For instance at the increasing of the temperature the current Ip increases according to the variation of the bias present on the terminal Pr1.

Figure 6:
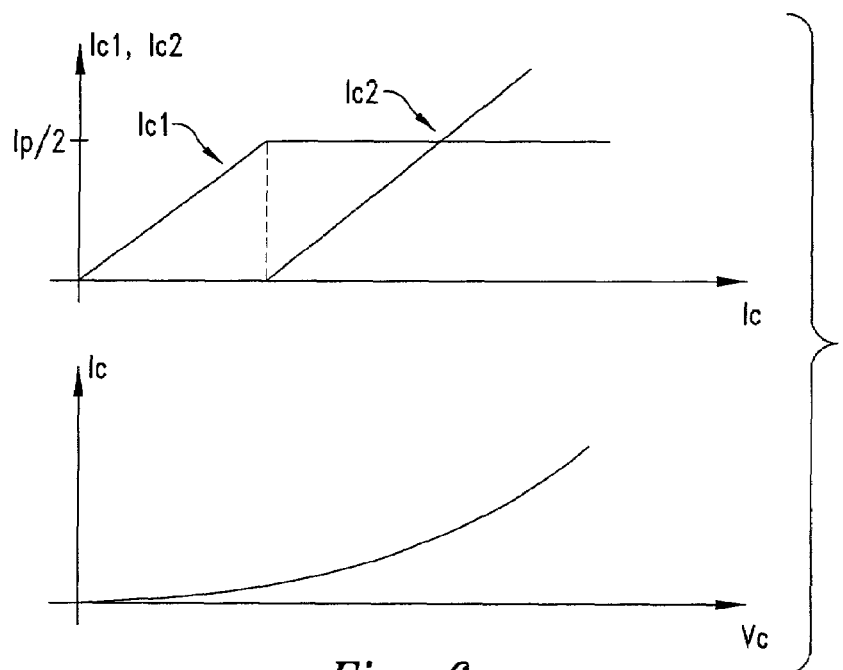
FIG. 6 shows a diagram that shows the course of the voltage to the terminal of the capacitor 6 and the course of the control current of the adaptive filter 1.

In FIG. 6 could be seen the waveforms of some signals of the circuit of FIG. 5. Particularly it is possible to see the exponential relationship between the input voltage Vc applied to the terminal 44 of the transistor 45 and its relative drain current Ic. Moreover it is possible to see the course of the current Ic1 and Ic2 flowing respectively in the mirrors 48 and 51 and correspondent to the bias and control current present on the terminals Pc1 and Pc2.

As already said, FIG. 5 represents for simplicity a reduced circuit able to provide only two currents to the terminals Pc1 and Pc2. However, one can imagine a series of currents one for each pole and one for each zero present in the filter 1 and also the current or preferably the currents necessary to increase the continuous gain. The currents relative to each couple of poles/zeros, positioned in frequency in the same place, will have a similar course as, better explained further on, they will have to move simultaneously, after that the couple of poles/zeros placed immediately at a smaller frequency will move.

Figure 7:
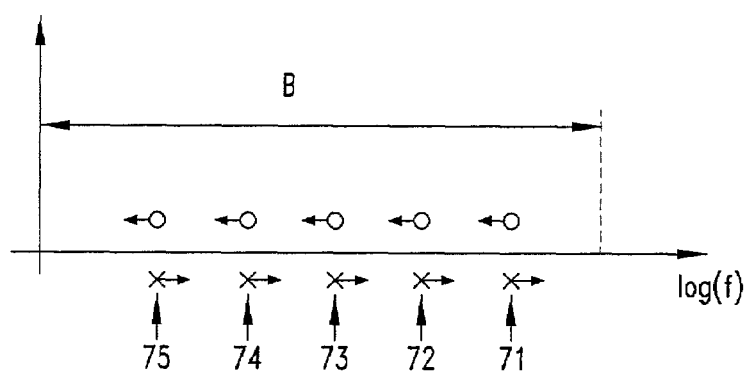
FIG. 7 shows a diagram that shows the positioning and the variations of the poles/zeros in the frequency plane.

FIG. 7 shows a diagram that shows the positioning of the poles/zeros in the frequency plane, particularly it is possible to note the uniform spacing between the couples of poles/zeros along a logarithmic frequency axis inside the band B of the working frequencies of the filter. Besides it is possible to note the displacement direction that the poles and the zeros effect at the varying (at the increasing) of the line attenuation, in response of the variations of the bias current to the terminals Pc1–Pcn. Particularly the poles move toward the high frequency and the zeros move toward the low frequency. Besides the couples of poles/zeros move in succession (in the indicated direction) beginning from the identifying number 71 up to the number 75, finally the filter continuous gain increases and makes the opportune bias currents vary. In practice, the pole and the zero of the couple 71 placed at high frequency inside the working band move first, then in succession the pole and the zero of the couple 72 move next and so forth up to the movement of the couple 75 placed at a lower frequency. Therefore, when all the couples have moved, the continuous gain is increased. All the displacement above reported are effected in consequence of the variations of the bias and control current present on the terminals Pc1–Pcn.

In one embodiment, the pole and zero are moved approximately 30% compared to their initial position.

Figure 8:
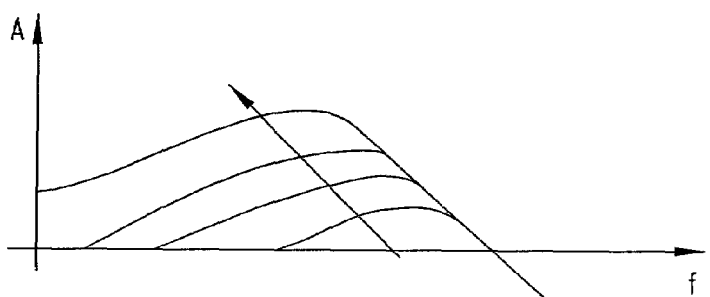
FIG. 8 shows a diagram that shows the course of the transfer function of the filter 1 in the frequency at the varying of the line attenuation.

In FIG. 8 is shown a diagram of the transfer function of the filter 1 in function of the frequency at the varying of the line attenuation, the arrow points out as varies the transfer function at the increasing of the line attenuation. At the moving of the couples of poles/zeros above mentioned it is possible to see in FIG. 8 the variation of the transfer function and particularly it is possible to see that only at the end the continuous gain is varied.

Figure 9:
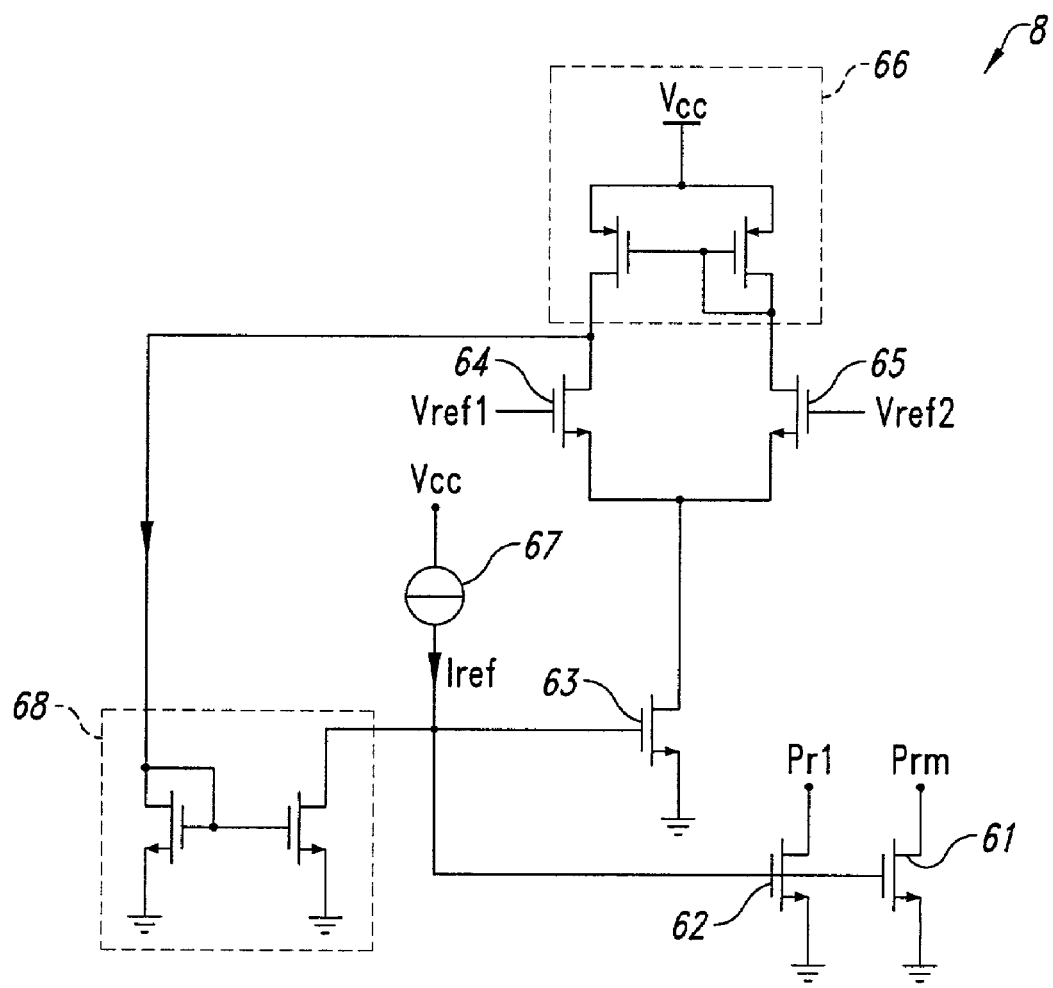
FIG. 9 shows a schematic circuit of a bias generator 8 dependent on the process.

A schematic circuit of an example of a bias generator 8 dependent from the process, shown in FIG. 9, comprises a plurality of n-channel transistors 61 and 62 having sources connected to ground, drains respectively connected to the terminals Pr1–Prm, and gates connected together and connected to a node connected to a gate of a transistor 63, a terminal of a generator of current Iref 67, and a branch of a first current mirror 68. The source of the transistor 63 is connected to ground and the drain is connected to the source of a differential couple formed by the n-channel transistors 64 and 65 having gates respectively connected to two reference voltages Vref1 and Vref2, with Vref2>Vref1, and drains connected to a second current mirror 66 connected to the power supply Vcc. The drain of the transistor 64 is also connected to a branch of the mirror 68. This circuit generates currents able to compensate the variations in temperature, of the supply voltage and of the dispersions of the characteristics (from device to device) due to the construction process.

In accordance with the present invention it is possible to realize a device in CMOS technology at low cost with the possibility of being integrated with other circuits on the same chip where external circuits are not required. Besides a good equalization with a reduced number of poles and zeros is obtained, in fact with 5 poles and 5 zeros and an equalization band of 260 MHz it is possible to equalize signals transmitted on a line of length of about 350 m.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method to equalize signals transmitted on a line, the method comprising:
    applying in series with said line, an analog adaptive filter having a working frequency band, a pole, and a zero, the pole and zero each having a position in said working frequency band that is variable in response to attenuation of said line;
    applying to an output of said filter a retroaction circuit able to vary the position of said pole and said zero;
    setting said pole and zero in correspondence to an initial frequency of said working frequency band;
    moving the position of said pole toward high frequencies at an increasing of said attenuation of said line; and
    moving the position of said zero toward low frequencies at the increasing of said attenuation of said line.

2. A method in accordance to the claim 1 wherein the pole and zero are a first pole/zero couple and the initial frequency is a first initial frequency, the method further comprising:
    positioning a second pole/zero couple of said analog adaptive filter at a second initial frequency in said working frequency band, wherein said first initial frequency is greater than said second initial frequency and the second pole/zero couple includes a pole and a zero;
    uniformly spacing said first and second initial frequencies along a logarithmic axis in said working frequency band;
    moving the poles of said first and second pole/zero couples toward the high frequencies at the increasing of said attenuation of said line; and
    moving the zeros of said first and second pole/zero couples toward the low frequencies at the increasing of said attenuation of said line.

3. A method in accordance to the claim 2 wherein moving the poles and zeros of the first and second pole/zero couples include first moving the pole and zero of the first pole/zero couple and in succession moving the pole and zero of the second pole/zero couple at the increasing of said attenuation of said line.

4. A method in accordance to the claim 1 wherein said pole and zero are placed in working frequency band in correspondence of said initial frequency in order to equalize the attenuation of said line when said line has null attenuation.

5. A method in accordance to the claim 1 wherein said pole and said zero are moved approximately 30% compared to their initial position.

6. A method in accordance to the claim 1, further comprising increasing a continuous gain of said adaptive filter after moving the position of said pole and zero.

7. A method in accordance to the claim 1 wherein said retroaction circuit includes a compensation circuit that compensates for thermal and constructive variations.

8. An equalizer circuit of signals transmitted on a line having an attenuation comprising:

an analog adaptive filter coupled in series with said line and including plural transconductance filters and a plurality of pole/zero couples, each transconductance filter having a respective bias current and a pole/zero couple, each pole/zero couple having a zero and a pole, the pole and zero of each pole/zero couple having a respective position in frequency in a working band that is variable in response to said respective bias current; and a retroaction circuit coupled to an output of said adaptive filter and able to vary said respective bias currents, each bias current varying at a varying of said attenuation of said line; wherein each bias current of said plural transconductance filters has an initial value and is made to vary at an increase of said attenuation so that said pole of the transconductance filter having the bias current is moved toward high frequencies and said zero of the transconductance filter having the bias current is moved toward low frequencies.

9. An equalizer circuit in accordance to the claim 8 wherein:
said analog adaptive filter includes four transconductance filters;
said pole/zero couples are spaced uniformly along a logarithmic axis in said working frequency band;
said bias current is made to vary so that said poles of said pole/zero couples are moved toward the high frequencies at the increasing of said attenuation of said line; and
said bias current is made to vary so that said zeros of said pole/zero couples are moved toward the low frequencies at the increasing of said attenuation of said line.

10. An equalizer circuit in accordance to the claim 8, further comprising a bias generating circuit able to modify said bias currents in response to temperature variations.

11. An equalizer circuit in accordance to the claim 8 wherein the equalizer circuit is realized in CMOS technology.

12. An equalizer for signals transmitted on a line having an attenuation, the equalizer comprising:
an adaptive filter including:
an input coupled to an input portion of the line;
an output coupled to an output portion of the line;
a first transconductance filter having a bias input at which a first bias current is produced; and
a second transconductance filter having a bias input at which a second bias current is produced;
a line attenuation detector coupled to the output of the adaptive filter and structured to detect attenuation in the line; and
a variable bias generator having an input coupled to the line attenuation detector, a first output coupled to the bias input of the first transconductance filter, and a second output coupled to the bias input of the second transconductance filter, the variable bias generator being structured to vary the first and second bias currents in response to receiving an indication from the line attenuation detector that the attenuation has changed, wherein the variable bias generator includes:
an input transistor having an input terminal coupled to the line attenuation detector, a first conduction terminal, and a second conduction terminal coupled to a first reference voltage;
a first current mirror having a first leg coupled to the first conduction terminal of the input transistor and a second leg; and a second current mirror having a first leg coupled to the second leg of the first current mirror and a second leg coupled to the bias input of the first transconductance filter.

13. The equalizer of claim 12 wherein the variable bias generator includes:
a connecting transistor having an input terminal coupled to a second reference voltage, a first conduction terminal, and a second conduction terminal coupled to the first conduction terminal of the input transistor; and
a third current mirror having a first leg coupled to the first conduction terminal of the connecting transistor and a second leg; and
a fourth current mirror having a first leg coupled to the second leg of the third current mirror and a second leg coupled to the bias input of the second transconductance filter.

14. The equalizer of claim 12 wherein the variable bias generator further includes:
a third current mirror having a first leg that includes the first and second current mirrors and a second leg on which a reference current is produced.

15. The equalizer of claim 14 wherein the variable bias generator includes a bias transistor having an input terminal, a first conduction terminal coupled to the second leg of the third current mirror, and a third conduction terminal coupled to the first reference voltage, the equalizer further comprising:
a bias generator coupled to the input terminal of the bias transistor, the bias generator being structured to compensate the bias current against temperature changes.

16. The equalizer of claim 15 wherein the bias generator includes:
a differential couple having an output; and
a fourth current mirror having a first leg coupled to the output of the differential couple and a second leg coupled to the input terminal of the bias transistor.

17. An equalizer for signals transmitted on a line having an attenuation, the equalizer comprising:
an adaptive filter including:
an input coupled to an input portion of the line;
an output coupled to an output portion of the line;
a first transconductance filter having a bias input at which a first bias current is produced; and
a second transconductance filter having a bias input at which a second bias current is produced;
a line attenuation detector coupled to the output of the adaptive filter and structured to detect attenuation in the line;
a variable bias generator having an input coupled to the line attenuation detector, a first output coupled to the bias input of the first transconductance filter, and a second output coupled to the bias input of the second transconductance filter, the variable bias generator being structured to vary the first and second bias currents in response to receiving an indication from the line attenuation detector that the attenuation has changed;
a charge pump having an input connected to the line attenuation detector and an output connected to the variable bias generator; and
a capacitor connected between the output of the charge pump and a reference voltage.

18. The equalizer of claim 17 wherein the charge pump includes:

a p-channel transistor having a gate coupled to the line attenuation detector, a source coupled to a supply voltage, and a drain coupled to the capacitor; and an n-channel transistor having a gate coupled to the gate of the p-channel transistor, a drain coupled to the drain of the p-channel transistor, and a source coupled to the reference voltage.

19. An equalizer for signals transmitted on a line having an attenuation, the equalizer comprising:

an adaptive filter including:
- an input coupled to an input portion of the line;
- an output coupled to an output portion of the line;
- a first transconductance filter having a bias input at which a first bias current is produced; and
- a second transconductance filter having a bias input at which a second bias current is produced;

a line attenuation detector coupled to the output of the adaptive filter and structured to detect attenuation in the line;

a variable bias generator having an input coupled to the line attenuation detector, a first output coupled to the bias input of the first transconductance filter, and a second output coupled to the bias input of the second transconductance filter, the variable bias generator being structured to vary the first and second bias currents in response to receiving an indication from the line attenuation detector that the attenuation has changed; and a comparator having a first input coupled to the output portion of the line, a second input coupled to a voltage reference, and an output coupled to the line attenuation detector.

20. The equalizer of claim 19 wherein the line attenuation detector includes:

a NOR gate having first and second inputs and an output;

a first bistable circuit having a first input coupled to the output of the comparator and to the second input of the NOR gate, a second input coupled to the output of the NOR gate, and an output coupled to the first input of the NOR gate; and a second bistable circuit having an input coupled to the output of the first bistable circuit and an output coupled to the variable bias generator.

21. A method to equalize signals transmitted on a line, the method comprising:

coupling to the line, an analog adaptive filter having a working frequency band, a pole, and a zero, the pole and zero each having a position in the working frequency band that is variable in response to attenuation of the line, and the pole and zero each having an initial frequency;

moving the position of the pole toward high frequencies at an increasing of the attenuation of the line; and moving the position of the zero toward low frequencies at the increasing of the attenuation of the line.

22. The method of claim 21 wherein the pole and zero are a first pole/zero couple and the initial frequency is a first initial frequency, the method further comprising:

positioning a second pole/zero couple of the analog adaptive filter at a second initial frequency in the working frequency band, wherein the first initial frequency is greater than the second initial frequency and the second pole/zero couple includes a pole and a zero;

positioning a third pole/zero couple of the analog adaptive filter at a third initial frequency in the working frequency band, wherein the second initial frequency is greater than the third initial frequency and the third pole/zero couple includes a pole and a zero;

uniformly spacing the first, second, and third initial frequencies along a logarithmic axis in the working frequency band;

moving the poles of the first, second, and third pole/zero couples toward the high frequencies at the increasing of the attenuation of the line; and moving the zeros of the first, second, and third pole/zero couples toward the low frequencies at the increasing of the attenuation of the line.

23. The method of claim 22 wherein moving the poles and zeros include first moving the pole and zero of the first pole/zero couple and then moving in succession the poles and zeros of the second and third pole/zero couples at the increasing of the attenuation of the line.

24. The method of claim 21, further comprising increasing a continuous gain of the adaptive filter after moving the position of the pole and zero.

* * * * *